United States Patent
Kurihara et al.

(10) Patent No.: US 6,964,838 B2
(45) Date of Patent: Nov. 15, 2005

(54) POSITIVE PHOTORESIST COMPOSITION

(75) Inventors: Masaki Kurihara, Kanagawa (JP); Takako Suzuki, Kanagawa (JP); Kenji Maruyama, Kanagawa (JP); Satoshi Niikura, Kanagawa (JP); Kousuke Doi, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 38 days.

(21) Appl. No.: 10/035,137

(22) Filed: Jan. 4, 2002

(65) Prior Publication Data
US 2002/0132178 A1 Sep. 19, 2002

(30) Foreign Application Priority Data
Jan. 17, 2001 (JP) .................................. 2001-009372

(51) Int. Cl.[7] .............................................. G03F 7/023
(52) U.S. Cl. .................... 430/191; 430/192; 430/193
(58) Field of Search ..................... 430/165, 191, 430/192, 193

(56) References Cited

U.S. PATENT DOCUMENTS

| 5,290,657 | A |   | 3/1994 | Uetani et al. | |
|---|---|---|---|---|---|
| 5,407,779 | A |   | 4/1995 | Uetani et al. | |
| 5,652,081 | A |   | 7/1997 | Tan et al. | |
| 5,726,217 | A |   | 3/1998 | Ichikawa et al. | |
| 5,738,968 | A |   | 4/1998 | Hosoda et al. | |
| 5,747,218 | A | * | 5/1998 | Momota et al. | 430/192 |
| 5,866,724 | A |   | 2/1999 | Ichikawa et al. | |
| 5,912,102 | A | * | 6/1999 | Kawata et al. | 430/191 |
| 5,985,507 | A |   | 11/1999 | Blakeney et al. | |
| 6,379,859 | B2 | * | 4/2002 | Suzuki et al. | 430/191 |

FOREIGN PATENT DOCUMENTS

| JP | 3-191351 A | 8/1991 |
|---|---|---|
| JP | 6-167805 A | 6/1994 |
| JP | 10-232492 A | 9/1998 |
| JP | 2000-338661 A | 12/2000 |

* cited by examiner

*Primary Examiner*—John S. Chu
(74) *Attorney, Agent, or Firm*—Sughrue Mion, PLLC

(57) ABSTRACT

A composition includes (A) an alkali-soluble resin, (B) a quinonediazide ester of a compound represented by the following formula:

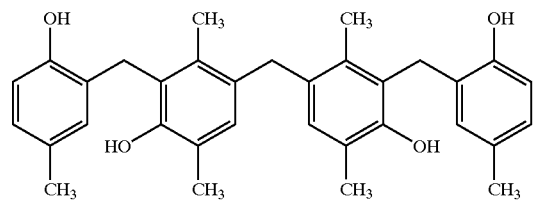

and (C) a compound represented by the following formula:

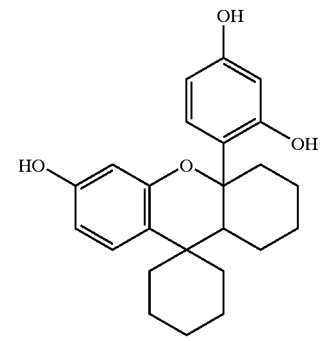

This composition is a positive photoresist composition that is excellent in sensitivity and definition and causes less shrink.

4 Claims, No Drawings

POSITIVE PHOTORESIST COMPOSITION

BACKGROUND OF THE INVENTION

1. Field of the Invention

The present invention relates to a positive photoresist composition that is excellent in sensitivity and definition and is advantageously used for patterning a resist with less shrink.

2. Description of the Related Art

In photolithography processes using i-line (365 nm), demands have been made on photoresist materials that can form an ultrafine resist pattern of not more than half a micrometer, particularly of not more than 0.35 μm. As such photoresist materials, positive photoresist compositions each comprising an alkali-soluble novolak resin and a non-benzophenone naphthoquinonediazido-group-containing compound (a photosensitizer) have been proposed.

For example, Japanese Patent Laid-Open No. 6-167805 mentions that a positive photoresist material using an esterified product between a tetra- to hepta-nuclear linear polyphenol compound and a naphthoquinonediazidosulfonic acid compound is a high-definition material for use in photolithography processes using i-line.

Photolithography processes using short-wavelength light sources such as KrF excimer laser (248 nm) and ArF excimer laser (193 nm) are suitable for the formation of resist patterns of not more than 0.35 μm. However, manufacturing lines using these light sources require a large amount of spending on new plants and equipment, and such spending is nearly unrecoverable.

Under these circumstances, strong demands have been made on the use of the photolithography processes using i-line (365 nm) from now on, which are widely used at present, and techniques of ultrafine processing of resist patterns of not more than 0.35 μm using photoresist materials for i-line irradiation have been examined.

However, it has been believed that by using a light source having a wavelength greater than the size of the resulting resist pattern, a resist pattern having satisfactory sensitivity, definition, focal depth range properties and other properties cannot be obtained. For example, this type of resist patterns exhibits "shrink", the phenomenon that the resist pattern shrinks in a length direction upon shifting of the focus on the order of submicron from an optimal position during exposure. The shrink is often observed in both edges of a resist pattern comprising regular line-and-space (L&S) traces or in an isolation pattern or irregular resist pattern. Accordingly, the resulting pattern in, for example, a logical IC having complicated traces cannot be obtained in a good yield.

SUMMARY OF THE INVENTION

Accordingly, an object of the present invention is to solve the above problems and to provide a positive photoresist composition that is excellent in sensitivity and definition and can form a resist pattern with less shrink upon shifting of the focus even in the formation of an ultrafine resist pattern of not more than 0.35 μm.

After intensive investigations to achieve the above objects, the present inventors have found that a positive photoresist composition containing an alkali-soluble resin, a specific quinonediazide ester (a photosensitizer) and a specific compound (a sensitizer) is excellent in sensitivity and definition and causes less shrink. The present invention has been accomplished based on these findings.

Specifically, the present invention provides a positive photoresist composition including (A) an alkali-soluble resin, (B) a photosensitizer including a quinonediazide ester between a naphthoquinonediazidosulfonic acid compound and at least one of a compound represented by following Formula (I):

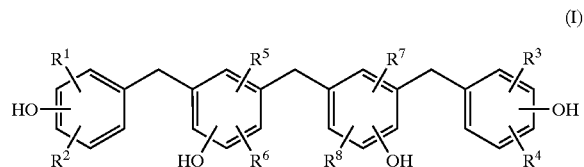

wherein $R^1$, $R^2$, $R^3$, $R^4$, $R^5$, $R^6$, $R^7$ and $R^8$ are each independently a hydrogen atom or an alkyl group having from 1 to 3 carbon atoms, and a compound represented by following Formula (II):

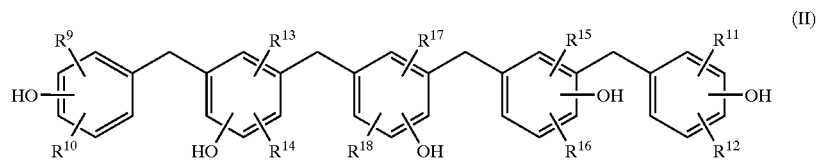

wherein $R^9$, $R^{10}$, $R^{11}$, $R^{12}$, $R^{13}$, $R^{14}$, $R^{15}$, $R^{16}$, $R^{17}$ and $R^{18}$ are each independently a hydrogen atom, an alkyl group having from 1 to 3 carbon atoms or a cyclohexyl group, and (C) a sensitizer including at least one of a compound represented by following Formula (III):

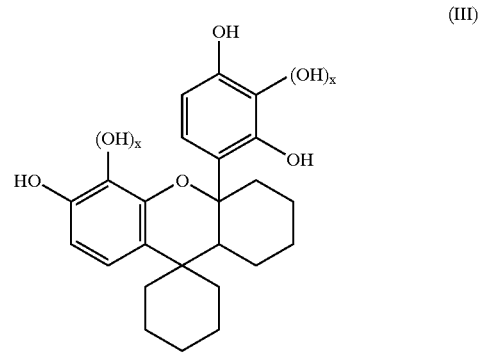

wherein x is 0 or 1.

The compound represented by Formula (I) in the positive photoresist composition is preferably a compound represented by the following formula:

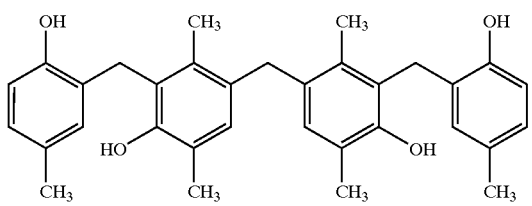

The compound represented by Formula (II) is preferably a compound represented by the following formula:

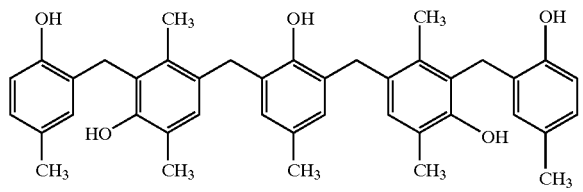

The compound represented by Formula (III) is preferably a compound represented by the following formula:

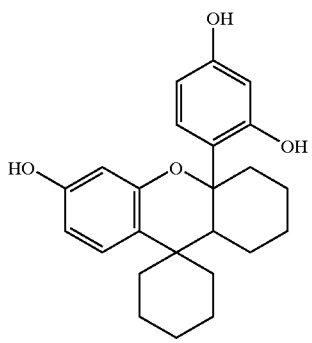

Alternatively, the compound represented by Formula (III) is preferably a compound represented by the following formula:

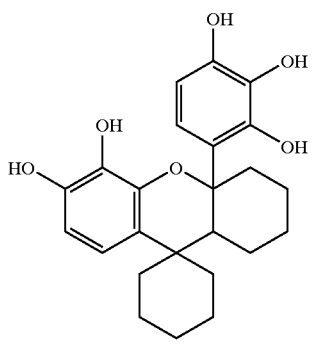

In this connection, one type of the compounds represented by Formula (III) is disclosed as a sensitizer in Japanese Patent No. 2629990. However, such conventional technologies fail to disclose the combination use of the compound represented by Formula (III) with the compound represented by Formula (I) and/or the compound represented by Formula (II).

The present invention can therefore provide a positive photoresist composition that: is excellent in sensitivity and definition and can form a resist pattern with less shrink upon shifting of the focus even in the formation of an ultrafine resist pattern of not more than 0.35 μm.

DETAILED DESCRIPTION OF THE INVENTION

The present invention will be illustrated in detail below.

Ingredient (A): Alkali-soluble Resin

Alkali-soluble resins for use as the ingredient (A) are not specifically limited and can be optionally chosen from those generally used as film-forming substances in positive photoresist compositions. Of these resins, condensates of aromatic hydroxy compounds and aldehydes or ketones, polyhydroxystyrenes and derivatives thereof are preferable.

Such aromatic hydroxy compounds include, but are not limited to, phenol, m-cresol, p-cresol, o-cresol, and other cresols; 2,3-xylenol, 2,5-xylenol, 3,5-xylenol, 3,4-xylenol, and other xylenols ; m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol, 2-tert-butyl-5-methylphenol, and other alkyl-substituted phenols; p-methoxyphenol, m-methoxyphenol, p-ethoxyphenol, m-ethoxyphenol, p-propoxyphenol, m-propoxyphenol, and other alkoxy-substituted phenols; o-isopropenylphenol, p-isopropenylphenol, 2-methyl-4-isopropenylphenol, 2-ethyl-4-isopropenylphenol, and other isopropenyl-substituted phenols; phenylphenol, and other aryl-substituted phenols; 4,4'-dihydroxybiphenyl, bisphenol A, resorcinol, hydroquinone, pyrogallol, and other polyhydroxyphenols. Each of these compounds can be used alone or in combination.

The aldehydes include, but are not limited to, formaldehyde, paraformaldehyde, trioxane, acetaldehyde, propionaldehyde, butylaldehyde, trimethylacetaldehyde, acrolein (acrylaldehyde), crotonaldehyde, cyclohexanealdehyde, furfural, furylacrolein, benzaldehyde, terephthalaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, p-chlorobenzaldehyde, and cinnamaldehyde. Each of these aldehydes can be used alone or in combination. Of these aldehydes, formaldehyde is desirable for its availability. The combination use of a hydroxybenzaldehyde and formaldehyde is specifically preferred in order to improve heat resistance.

The ketones include, for example, acetone, methyl ethyl ketone, diethyl ketone, and diphenyl ketone. Each of these ketones may be used alone or in combination. Further, an appropriate combination of an aldehyde and a ketone can be employed.

The condensate of an aromatic hydroxy compound and an aldehyde or a ketone can be prepared in the presence of an acidic catalyst according to a known technique. Such acidic catalysts include, but are not limited to, hydrochloric acid, sulfuric acid, formic acid, oxalic acid, and p-toluenesulfonic acid.

The polyhydroxystyrenes and derivatives thereof include, but are not limited to, vinylphenol homopolymers, and copolymers of vinylphenol and a copolymerizable comonomer. Such comonomers include, for example, acrylic acid derivatives, acrylonitrile, methacrylic acid derivatives, methacrylonitrile, styrene, a-methylstyrene, p-methylstyrene, o-methylstyrene, p-methoxystyrene, p-chlorostyrene, and other styrene derivatives.

Of these alkali-soluble resins for use in the present invention as the ingredient (A), preferred resins are alkali-soluble novolak resins each having a weight average molecular weight (Mw) of from 2000 to 20000, and typically from 3000 to 12000. These alkali-soluble resins preferably have a molecular weight dispersion (Mw/Mn) of from 2 to 5. Among them, alkali-soluble novolak resins obtained by a condensation reaction of m-cresol and p-cresol with formaldehyde, and alkali-soluble novolak resins obtained by a condensation reaction of m-cresol, p-cresol and 2,3,5-trimethylphenol with formaldehyde are preferred to yield positive photoresist compositions having high sensitivity and wide exposure margin.

Ingredient (B): Photosensitizer

According to the present invention, an ester (hereinafter referred to as "quinonediazide ester") of a napthoquinonediazidosulfonic acid compound with at least one of the compounds represented by Formulae (I) and (II) is used as the ingredient (B) (photosensitizer). By this configuration, the resulting positive photoresist composition has excellent definition.

The quinonediazide ester of the compound represented by Formula (I) has an average esterification rate of preferably from 25% to 90% and more preferably from 45% to 75%. If the average esterification rate is less than 25%, the resulting photoresist composition may exhibit deteriorated film residual rate and definition, and in contrast, if it exceeds 90%, the photoresist composition may exhibit deteriorated sensitivity and increased scum.

The quinonediazide ester of the compound represented by Formula (II) has an average esterification rate of preferably from 20% to 90% and more preferably from 30% to 80%. If the average esterification rate is less than 20%, the resulting photoresist composition may exhibit deteriorated film residual rate and definition, and in contrast, if it exceeds 90%, the photoresist composition may exhibit deteriorated sensitivity and increased scum.

Among the compounds represented by Formula (I) for use in the ingredient (B) (photosensitizer), typically preferred is a compound represented by the following formula:

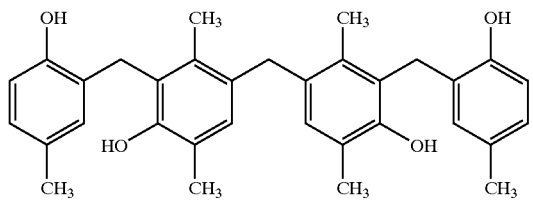

By using this compound, the resulting positive photoresist composition has further improved sensitivity and definition and causes less shrink.

Among the compounds represented by Formula (II) for use in the ingredient (B) (photosensitizer), typically preferred is a compound represented by the following formula:

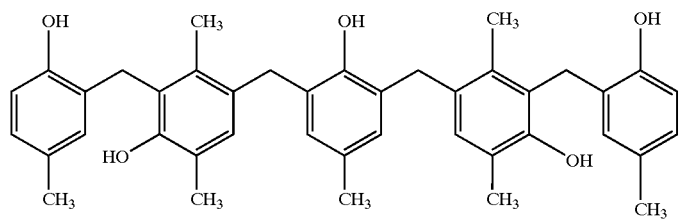

By using this compound, the resulting positive photoresist composition has further improved sensitivity and definition and causes less shrink.

The positive photoresist composition of the present invention may further comprise additional quinonediazide esters as the ingredient (B) according to necessity, in addition to the quinonediazide esters of the compounds represented by Formulae (I) and (II). Such quinonediazide esters include, but are not limited to, quinonediazide esters of polyphenol compounds represented by following Formula (IV):

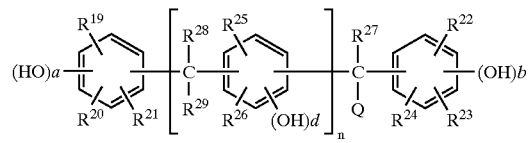

(IV)

wherein $R^{19}$ to $R^{26}$ are each independently a hydrogen atom, a halogen atom, an alkyl group having from 1 to 6 carbon atoms, an alkoxy group having from 1 to 6 carbon atoms, or a cycloalkyl group; $R^{27}$ to $R^{29}$ are each independently a hydrogen atom or an alkyl group having from 1 to 6 carbon atoms; Q is a hydrogen atom, an alkyl group having from 1 to 6 carbon atoms, or Q is combined with $R^{27}$ to form a cyclic ring having from 3 to 6 carbon atoms, or a residue represented by the following formula:

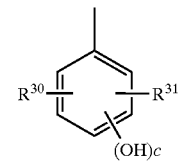

wherein $R^{30}$ and $R^{31}$ are each independently a hydrogen atom, a halogen atom, an alkyl group having from 1 to 6 carbon atoms, an alkoxy group having from 1 to 6 carbon atoms, or a cycloalkyl group; and c is an integer of from 1 to 3; a and b are each an integer of from 1 to 3; d is an integer of from 0 to 3; and n is an integer of from 0 to 3. Such polyphenol compounds include, for example, linear trinuclear compounds, linear tetranuclear compounds, linear pentanuclear compounds, and trisphenol polyphenol compounds, other than the compounds represented by Formulae (I) and (II).

The amount of these additional quinonediazide esters, if any, is preferably less than or equal to 75% by weight, and more preferably less than or equal to 50% by weight based on the weight of the ingredient (B). If the amount of the additional quinonediazide esters exceeds 75% by weight, the resulting positive photoresist composition may have deteriorated definition.

The content of the ingredient (B) in the positive photoresist composition of the present invention is preferably from 20% to 60% by weight, and more preferably from 30% to 50% by weight relative to the total weight of the alkali-soluble resin ingredient (A) and the sensitizer (intensifier) ingredient (C) described below. If the content of the ingredient (B) is less than 20% by weight, images in exact accordance with patterns may not be obtained, and transferring property may be deteriorated. In contrast, if the content exceeds 60% by weight, sensitivity and uniformity of the resulting resist film tend to be deteriorated to thereby deteriorate definition.

Ingredient (C): Sensitizer the sensitizer (intensifier) for use in the present invention is an alkali-soluble low molecular weight compound having a molecular weight of less than or equal to about 1000 and having a phenolic hydroxyl group.

According to the present invention, the specific compound represented by Formula (III) as the sensitizer (C) is used in combination with the specific quinonediazide esters. By this configuration, the resulting positive photoresist composition has high definition, causes less shrink and is therefore suitable in the fields of the formation of complicated circuit traces such as in logical ICs.

Among the compounds represented by Formula (III) for use as the ingredient (C), typically preferred is a compound represented by the following formula:

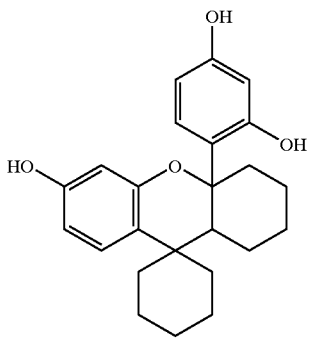

By using this compound, the resulting positive photoresist composition has further improved sensitivity and definition and causes less shrink.

Alternatively, the compound represented by Formula (III) is preferably a compound represented by the following formula:

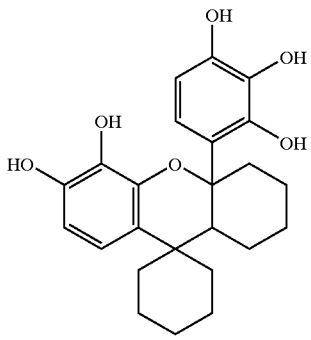

By using this compound, the resulting positive photoresist composition has further improved sensitivity and definition and causes less shrink.

The positive photoresist composition may further comprise additional alkali-soluble low molecular weight compounds each having a phenolic hydroxyl group as the ingredient (C), in addition to the compounds represented by Formula (III).

Such low molecular weight compounds include, for example, the polyphenol compounds represented by Formula (IV), such as 2,6-bis(2,5-dimethyl-4-hydroxyphenylmethyl)-4-methylphenol, bis(4-hydroxy-2,3,5-trimethylphenyl)-2-hydroxyphenylmethane, 1,4-bis[1-(3,5-dimethyl-4-hydroxyphenyl)isopropyl]benzene, 2,4-bis(3,5-dimethyl-4-hydroxyphenylmethyl)-6-methylphenol, bis(4-hydroxy-3,5-dimethylphenyl)-2-hyroxyphenlmethane), bis(4-hydroxy-2,5-dimethylphenyl)-2-hydroxyphenylmethane, bis(4-hydroxy-3,5-dimethylphenyl)-3,4-dihydroxyphenylmethane, 1-[1-(4-hydroxyphenyl)isopropyl]-4-[1,1-bis(4-hydroxyphenyl)ethyl]benzene, 1-[1-(3-methyl-4-hydroxyphenyl)isopropyl]-4-[1,1-bis(3-methyl-4-hydroxyphenyl)ethyl]benzene, 2,6-bis[1-(2,4-dihydroxyphenyl)isopropyl]-4-methylphenol, 4,6-bis[1-(4-hydroxyphenyl)isopropyl]resorcin, 4,6-bis(3,5-dimethoxy-4-hydroxyphenylmethyl)pyrogallol, 4,6-bis(3,5-dimethyl-4-hydroxyphenylmethyl)pyrogallol, 2,6-bis(3-methyl-4,6-dihydroxyphenylmethyl)-4-methylphenol, 2,6-bis(2,3,4-trihydroxyphenylmethyl)-4-methylphenol, and 1,1-bis(4-hydroxyphenyl)cyclohexane.

The content of these additional alkali-soluble low molecular weight compounds each having a phenolic hydroxyl group, if any, is preferably less than or equal to 75% by weight and more preferably less than or equal to 50% by weight based on the total weight of the ingredient (C). If the content exceeds 75% by weight, the formation of shrink may not effectively be suppressed.

The amount of the ingredient (C) is preferably from 20% to 50% by weight and more preferably from 30% to 40% by weight, relative to the weight of the ingredient (A) alkali-soluble resin.

In addition to the above specified ingredients, where necessary, the positive photoresist composition of the present invention may further comprise any of compatible additives including, for example, ultraviolet absorbents for inhibition of halation and surfactants for prevention of striation within ranges not adversely affecting the objects of the invention. Such ultraviolet absorbents include, for example, 2,2'4,4'-tetrahydroxybenzophenone, 4-dimethylamino-2',4'-dihydroxybenzophenone, 5-amino-3-methyl-1-phenyl-4-(4-hydroxyphenylazo)pyrazole, 4-dimethylamino-4'-hydroxyazobenzene, 4-diethylamino-4'-ethoxyazobenzene, 4-diethylaminoazobenzene and curcumin. The surfactants include, but are not limited to, Fluorad FC-430 and FC-431 (trade names, available from Fluorochemical-Sumitomo 3M Co.), EFTOP EF122A, EF122B, EF122C and EF126 (trade names, available from Tohkem Products Corporation) and other fluorine-containing surfactants.

The positive photoresist composition of the present invention is preferably used as a solution prepared by dissolving each of the ingredients (A), (B) and (C) and other additional ingredients in an appropriate solvent. Such solvents include those conventionally used in positive photoresist compositions, such as acetone, methyl ethyl ketone, cyclohexanone, methyl isoamyl ketone, 2-heptanone, and other ketones; ethylene glycol, propylene glycol, diethylene glycol, ethylene glycol monoacetate, propylene glycol monoacetate, diethylene glycol monoacetate, or monomethyl ethers, monoethyl ethers, monopropyl ethers, monobutyl ethers or monophenyl ethers thereof, and other polyhydric alcohols and derivatives thereof; dioxane and other cyclic ethers; and ethyl lactate, methyl acetate, ethyl acetate, butyl acetate, methyl pyruvate, ethyl pyruvate, methyl methoxypropionate, ethyl ethoxypropionate, and other esters. Each of these solvents can be used alone or in combination. of these solvents, typically preferred solvents are acetone, methyl ethyl ketone, cyclohexanone, methyl isoamyl ketone, 2-heptanone, and other ketones; and ethyl lactate, methyl acetate, ethyl acetate, butyl acetate, methyl pyruvate, ethyl pyruvate, methyl methoxypropionate, ethyl ethoxypropionate, and other esters.

Practically, the positive photoresist composition of the present invention may preferably be used, for example, in the following manner: Each of the ingredients (A), (B) and (C) and other ingredients added according to necessity is dissolved in an appropriate solvent as mentioned above to yield a coating solution; the coating solution is then applied, using a spinner or the like, onto a substrate such as a silicon wafer or a substrate carrying an anti-reflection coating formed thereon, and is then dried to form a photosensitive layer; next, the photosensitive layer is irradiated with and is exposed to light through a desired mask pattern; and the exposed portions of the film are then dissolved and removed by dipping the substrate in a developer solution, for example, an alkaline aqueous solution such as a 1% to 10% by weight tetramethylammonium hydroxide (TMAH) aqueous solution, thus forming an image being in exact accordance with the mask pattern.

EXAMPLES

The present invention will be further illustrated in detail with reference to several examples and comparative examples below which are not intended to limit the scope of the invention. The properties of the resulting positive photoresist compositions were evaluated by the following methods, and the results are shown in Table 2.

(1) Sensitivity

A sample was applied onto a silicon wafer using a spinner, and was dried on a hot plate at 90° C. for 90 sec. to form a resist film 1.0 µm thick. The resist film was then irradiated with light through a mask (reticle) corresponding to a 0.35-µm resist pattern with a line-and-space (L&S) width of 1:1 for an increasing period from 0.1 sec. at intervals of 0.01 sec. using a reducing-type projection aligner NSR-2005i10D (available from Nikon Corporation, Japan; NA=0.57). The film was then post-exposure baked (PEB) at 110° C. for 90 sec.; was subjected to developing in a 2.38% by weight tetramethylammonium hydroxide aqueous solution at 23° C. for 60 sec., was rinsed with water for 30 sec., and was dried. In this procedure, the sensitivity was defined as the exposure time period (Eop) in milliseconds (ms) to exactly reproduce a 0.35-µm mask pattern with a line-and-space (L&S) width of 1:1.

(2) Definition

The definition was defined as the critical definition at an exposure to reproduce a 0.35-µm mask pattern.

(3) Shrink Evaluation

A sample was applied onto a silicon wafer using a spinner and was dried on a hot plate at 90° C. for 90 sec. to form a resist film 1.0-µm thick. The resist film was then irradiated with light through a mask (reticle) corresponding to five parallel resist traces 0.35-µm wide and 1.0-µm long with a line-and-space (L&S) width of 1:1 for an increasing period from 0.1 sec. at intervals of 0.01 sec. using a reducing-type projection aligner NSR-2005i10D (available from Nikon Corporation, Japan; NA=0.57).

In this procedure, the resist film was irradiated at the optimum exposure time period (Eop) under the condition that the focus was shifted 1.0 µm from the optimum position of the focus toward the minus side (the upper side of the substrate).

The film was then post-exposure baked (PEB) at 110° C. for 90 sec.; was subjected to developing in a 2.38% by weight tetramethylammonium hydroxide aqueous solution at 23° C. for 60 sec., was rinsed with water for 30 sec., and was dried. In this procedure, the shrink was evaluated in accordance with the following criteria by taking the lengths in a longitudinal direction of the two resist traces at both ends of the five parallel resist traces as an index.

Criteria on Shrink Evaluation

Excellent: The lengths of the resulting traces were equal to or more than 0.9 µm and less than or equal to 1.0 µm, indicating that almost no shrink occurred.

Good: The lengths of the resulting traces were equal to or more than 0.8 µm and less than 0.9 µm, indicating that some shrink occurred.

Fair: The lengths of the resulting traces were equal to or more than 0.7 µm and less than 0.8 µm.

Failure: The lengths of the resulting traces were less than 0.7 µm.

Example 1

Ingredient (A): An alkali-soluble resin comprising 50 parts by weight of a novolak resin (a1) and 50 parts by weight of a novolak resin (a2). The novolak resin (a1) had a weight average molecular weight (Mw) in terms of polystyrene of 5000 and a molecular weight distribution (Mw/Mn) of 3.0 and was prepared from m-cresol/p-cresol/2,3,5-trimethylphenol=35/40/25 (by mole of charged material) using formaldehyde as a condensing agent. The novolak resin (a2) had a weight average molecular weight (Mw) in terms of polystyrene of 5000 and a molecular weight distribution (Mw/Mn) of 3.0 and was prepared from m-cresol/p-cresol=42.5/57.5 (by mole of charged material) using formaldehyde as a condensing agent.

Ingredient (B): (b1) A reaction product (esterification rate: 50%) between 1 mole of the following phenol compound and 2 moles of 1,2-naphthoquinonediazido-5-sulfonyl chloride (5-NQD).

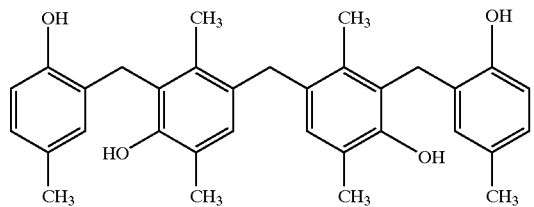

Ingredient C: The Following Compound (c1):

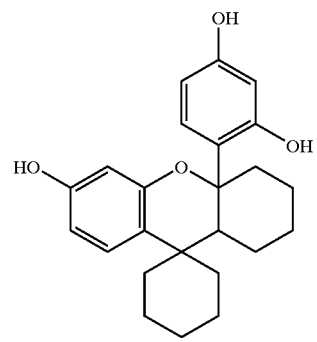

In 510 parts by weight of solvent mixture [ethyl lactate/butyl acetate=9/1 (by weight)], 100 parts by weight of the ingredient (A), 50 parts by weight of the ingredient (B), and 30 parts by weight of the ingredient (C) were dissolved, the resulting solution was filtrated through a 0.2-µm membrane filter and thereby yielded a positive photoresist composition.

Examples 2 to 7 and Comparative Examples 1 to 5

A series of positive photoresist compositions was prepared in the same manner as in Example 1, except that the ingredients (B) and (C) used in Example 1 were changed to those indicated in Table 1.

TABLE 1

|  | Ingredient (B) (compositional ratio (wt. %)) | Ingredient (C) (compositional ratio (wt. %)) |
|---|---|---|
| Example 1 | b1 (100) | c1 (100) |
| Example 2 | b2 (100) | c1 (100) |
| Example 3 | b1 (100) | c2 (100) |
| Example 4 | b1/b3 (80/20) | c1 (100) |
| Example 5 | b1/b4 (80/20) | c1 (100) |
| Example 6 | b1 (100) | c1/c3 (50/50) |
| Example 7 | b1 (100) | c1/c4 (50/50) |
| Comp. Ex. 1 | b1 (100) | c5 (100) |
| Comp. Ex. 2 | b1 (100) | c6 (100) |
| Comp. Ex. 3 | b1 (100) | c7 (100) |
| Comp. Ex. 4 | b5 (100) | c1 (100) |
| Comp. Ex. 5 | b6 (100) | c1 (100) | b1: A reaction product (esterification rate: 50%) between 1 mole of the following phenol compound and 2 moles of 5-NQD:

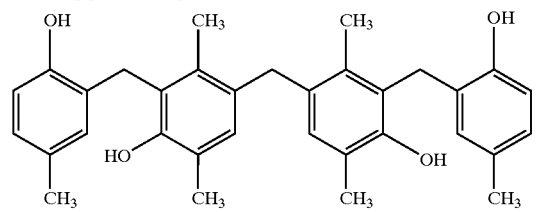

b2: A reaction product (esterification rate: 40%) between 1 mole of the following phenol compound and 2 moles of 5-NQD:

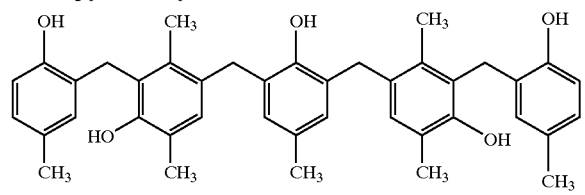

b3: A reaction product (esterification rate: 75%) between 1 mole of the following phenol compound and 3 moles of 5-NQD:

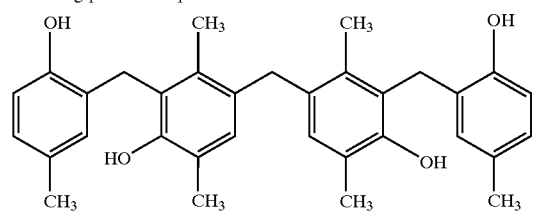

b4: A reaction product (esterification rate: 67%) between 1 mole of the following phenol compound and 2 moles of 5-NQD:

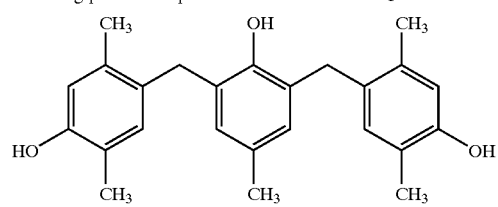

b5: A reaction product (esterification rate: 67%) of 1 mole of 2,3,4-trihydroxybenzophenone and 2 moles of 5-NQD.
b6: A reaction product (esterification rate: 75%) of 1 mole of 2,3,4,4'-tetrahydroxybenzophenone and 3 moles of 5-NQD.

TABLE 1-continued

|  | Ingredient (B) (compositional ratio (wt. %)) | Ingredient (C) (compositional ratio (wt. %)) |
|---|---|---| c1: The following compound:

[structure]

c2: The following compound:

[structure]

c3: The following compound:

[structure]

c4: The following compound:

[structure]

c5: The following compound:

[structure]

TABLE 1-continued

| | Ingredient (B) (compositional ratio (wt. %)) | Ingredient (C) (compositional ratio (wt. %)) |
|---|---|---| c6: The following compound:

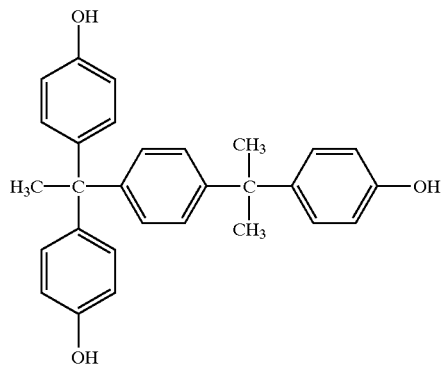

c7: The following compound:

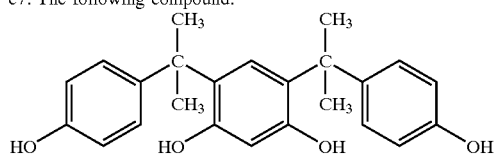

TABLE 2

| | Sensitivity (ms) | Definition (μm) | Shrink Evaluation |
|---|---|---|---|
| Example 1 | 400 | 0.30 | Excellent |
| Example 2 | 430 | 0.30 | Excellent |
| Example 3 | 380 | 0.30 | Excellent |
| Example 4 | 430 | 0.30 | Good |
| Example 5 | 430 | 0.30 | Good |
| Example 6 | 415 | 0.28 | Excellent |
| Example 7 | 415 | 0.30 | Good |
| Comp. Ex. 1 | 430 | 0.32 | Fair |
| Comp. Ex. 2 | 400 | 0.32 | Fair |
| Comp. Ex. 3 | 430 | 0.32 | Fair |
| Comp. Ex. 4 | 300 | 0.60 | Failure |
| Comp. Ex. 5 | 300 | 0.60 | Failure |

Table 2 shows that the photoresist compositions according to the present invention comprising the specific photosensitizers and sensitizers cause less shrink and are excellent in sensitivity and definition.

Other embodiments and variations will be obvious to those skilled in the art, and this invention is not to be limited to the specific matters stated above.

What is claimed is:

1. A positive photoresist composition comprising:
   (A) an alkali-soluble resin;
   (B) a photosensitizer comprising a quinonediazide ester between a naphthoquinonediazidosulfonic acid compound and a compound represented by following Formula (II):

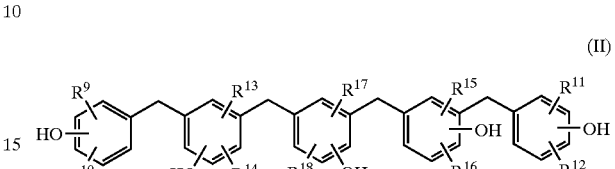

wherein $R^9$, $R^{10}$, $R^{11}$, $R^{12}$, $R^{13}$, $R^{14}$, $R^{15}$, $R^{16}$, $R^{17}$ and $R^{18}$ are each independently a hydrogen atom, an alkyl group having from 1 to 3 carbon atoms or a cyclohexyl group; and
   (C) a sensitizer comprising at least one of compounds represented by following Formula (III):

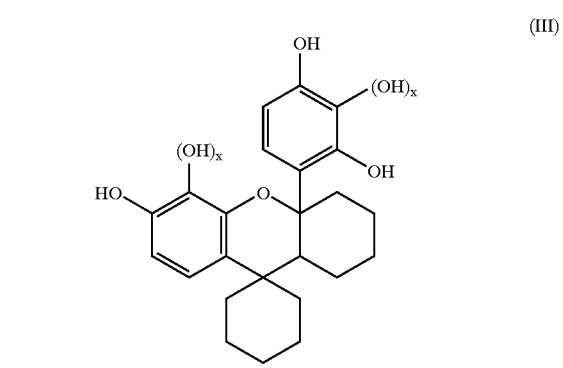

wherein x is 0 or 1.

2. The positive photoresist composition according to claim 1, wherein the compound represented by Formula (II) is a compound represented by the following formula:

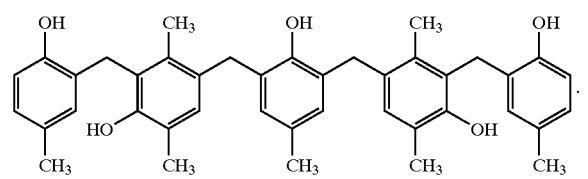

3. The positive photoresist composition according to claim 1, wherein the compound represented by Formula (III) is a compound represented by the following formula:

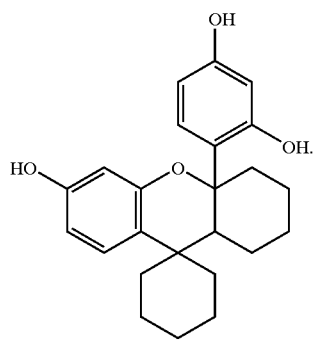
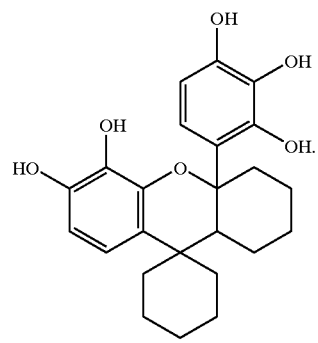
4. The positive photoresist composition according to claim 1, wherein the compound represented by Formula (III) is a compound represented by the following formula:
* * * * *